United States Patent [19]
Lin

[11] Patent Number: 5,565,286
[45] Date of Patent: Oct. 15, 1996

[54] COMBINED ATTENUATED-ALTERNATING PHASE SHIFTING MASK STRUCTURE AND FABRICATION METHODS THEREFOR

[75] Inventor: Burn J. Lin, Tampa, Fla.

[73] Assignee: International Business Machines Corporation, Armonk, N.Y.

[21] Appl. No.: 340,992

[22] Filed: Nov. 17, 1994

[51] Int. Cl.$^6$ ........................................................ G03F 9/00
[52] U.S. Cl. ........................ 430/005; 430/311; 430/323; 430/324; 430/394
[58] Field of Search ........................... 430/5, 311, 323, 430/324, 394

[56] References Cited

U.S. PATENT DOCUMENTS

| | | | |
|---|---|---|---|
| 4,806,442 | 2/1989 | Shirasaki et al. | 430/4 |
| 4,885,231 | 12/1989 | Chan | 430/321 |
| 4,890,309 | 12/1989 | Smith et al. | 378/35 |
| 4,902,899 | 2/1990 | Lin et al. | 250/492.1 |
| 5,045,417 | 9/1991 | Okamoto | 430/5 |
| 5,288,569 | 2/1994 | Lin | 430/5 |
| 5,384,219 | 1/1995 | Dao et al. | 430/5 |
| 5,429,897 | 7/1995 | Yoshioka et al. | 430/5 |

OTHER PUBLICATIONS

Marc D. Levenson et al., "Improving Resolution in Photolithography with a Phase–Shifting Mask," I.E.E.E. Transactions on Electron Devices, vol. ED–29, No. 12, Dec. 1982.

*Primary Examiner*—S. Rosasco
*Attorney, Agent, or Firm*—Perman & Green

[57] ABSTRACT

A structure and fabrication method for a phase-shifting lithographic mask wherein an attenuated phase-shifting mesh structure (Att PSM) is combined with an alternating-element phase shifting mask (Alt PSM) to provide a mask combination consisting of phase-shifted and unshifted attenuated backgrounds in which the phase-shifted attenuated backgrounds surrounds the unshifted components and the unshifted attenuated background surrounds the phase-shifted components.

7 Claims, 5 Drawing Sheets

COMBINED ATTENUATED-ALTERNATING PHASE SHIFTING MASK STRUCTURE AND FABRICATION METHODS THEREFOR

BACKGROUND OF THE INVENTION

1. Field of the Invention

This invention relates to masks for lithography and more particularly to phase-shift masks for use in photolithography.

2. Description of Related Art

In photolithography, masks are employed to expose a pattern upon a work piece. As manufacturing requirements call for exposure of patterns with smaller and smaller dimensions, it is becoming necessary to employ techniques which permit enhancement of the current performance of the process of photolithography. One approach is to use phase-shifting techniques in the ranges of wavelengths used in photolithography in the past.

At present, small features or small geometric patterns are created by using conventional optical photolithography. Typically, optical photolithography is achieved by projecting or transmitting light through a pattern made of optically opaque areas and optically clear areas on a mask. The optically opaque areas of the pattern block the light, thereby casting shadows and creating dark areas, while the optically clear areas allow the light to pass, thereby creating light areas. Once the light areas and the dark areas are formed, they are projected onto and through a lens and subsequently onto a substrate. However, because of increased semiconductor device complexity which results in increased pattern complexity, and increased pattern packing density on the mask, distance between any two opaque areas has decreased. By decreasing the distances between the opaque areas, small apertures are formed which diffract the light that passes through the apertures. The diffracted light results in effects that tend to spread or to bend the light as it passes so that the space between the two opaque areas is not resolved, therefore, making diffraction a severe limiting factor for optical photolithography.

A conventional method of dealing with diffraction effects in optical photolithography is achieved by using a phase-shift mask, which replaces the previously discussed mask. Generally, with light being thought of as a wave, phase-shifting is a change in timing of a shift in wave form of a regular sinusoidal pattern of light waves that propagate through a transparent material. Typically, phase-shifting is achieved by passing light through areas of a transparent material of either differing thicknesses or through materials with different refractive indexes or both, thereby changing the phase or the periodic pattern of the light wave. Phase-shift masks reduce diffraction effects by combining both diffracted light and phase-shifted diffracted light so that constructive and destructive interference takes place favorably.

One type of phase shift mask, as well as a detailed description of theory is disclosed in Marc D. Levenson et al., "Improving Resolution in Photolithography with a Phase-Shifting Mask," I.E.E.E. Transactions on Electron Devices, Vol. ED-29, No. 12, December 1982.

In his paper, "Phase-Shifting and Other Challenges in Optical Mask Technology, (short course on phase-shift mask technology, SPIE Conference, 1991) Burn J. Lin discusses a variety of phase-shifting techniques, including alternate phase shifting in which every other element in a closely packed array is phase-shifted, sub-resolution phase shifting which serves to enhance the edge contrast of patterns below the resolution limit of the given optical system, rim phase shifting in which phase shifting takes place solely at the rim of the patterns, and others. Lin tested the various types of phase shifting on five different feature patterns. All five features patterns were improved by rim phase shifting.

In addition to alternate phase shifting, there is another technique known as attenuated phase shifting wherein a mask is provided that includes absorbing material for attenuation of background regions surrounding the mask openings. In U.S. Pat. No. 5,288,569 issued Feb. 22, 1994 to Lin entitled FEATURE BIASSING AND ABSORPTIVE PHASE-SHIFTING TECHNIQUES TO IMPROVE OPTICAL PROJECTION IMAGING discloses a photolithography system wherein making the phase shifters absorptive facilitates a phase shifting mask system for arbitrary layouts. Combining phase shifters of different levels of absorption further enhance the improvements.

This patent also discusses another design where there is no absorber employed, only the phase shifter on the substrate carry the burden of patterning. The large phase shifter areas are printed everywhere inside and outside the features except at the edge, where due to the large phase transition, large dark line images are produced. In the small areas the edges are sufficiently close to each other so that a completely dark feature is created. Large dark images can be produced by grouping many subresolution phase shifter features closely together. Here, because the phase shifters are completely transparent as opposed to the attenuated phase shift mask to be described in the invention this particular phase shift mask system is called unattenuated (Utt) phase shift mask.

Other references related to the present technology are as follows:

U.S. Pat. No. 5,045,417 issued Sep. 3, 1991 to Okamoto entitled MASK FOR MANUFACTURING SEMICONDUCTOR DEVICE AND METHOD OF MANUFACTURE THEREOF relates to a microminiaturization technique to achieve the miniaturization and higher integration of IC chips and to the improvement of a mask used in its manufacturing process. In other words, the phase of lights transmitted through the mask is controlled within one mask pattern. Specifically, a transparent film is formed in such a manner that it covers a mask pattern along a pattern formed by magnifying or demagnifying the mask pattern or otherwise a groove is formed in a mask substrate. A phase difference of 180° is generated between the lights transmitted through the mask substrate and the transparent film or the groove, causing interference with each light to offset each other. Therefore, the pattern transferred onto a wafer has an improved resolution, being used in the invention.

U.S. Pat. No. 4,902,899 issued Feb. 20, 1990 to Lin et al entitled LITHOGRAPHIC PROCESS HAVING IMPROVED IMAGE QUALITY describes a lithographic process having improved image quality by employing a mask that includes a plurality of opaque elements or transparent elements that are smaller than the resolution of the lithography to be employed in order to control the transmittance of the actinic light exposure area.

U.S. Pat. No. 4,890,309 issued Dec. 26, 1989 to Smith et al entitled LITHOGRAPHY MASK WITH A π-PHASE SHIFTING ATTENUATOR discloses a lithographic system wherein the mask includes an attenuator which passes a fraction of the incident electromagnetic radiation and phase shifts the radiation relative to the radiation passing through open features of the mask by approximately an odd multiple of π radians. This phase shifting of light passing through the attenuator by π radians reduces the edge blurring that results from diffraction effects. The invention steepens the slope of the intensity profile at the edges of features in x-ray lithographic replication relative to the slope obtained with a conventional x-ray mask. The steeper slope is a highly significant advantage because it permits improved linewidth control.

U.S. Pat. No. 4,885,231, issued Dec. 5, 1989 to Chan entitled PHASE SHIFTED GRATING BY SELECTIVE IMAGE REVERSAL OF PHOTORESIST describes a system wherein image reversal is controlled to occur in lithographically defined regions of a positive photoresist. In that way, selective reversal of a simple holographic grating is achieved to obtain 180-degree phase shifts within lithographically defined regions of the grating. Such a phase-shifted grating is useful, for example, to provide distributed feedback in a semiconductor laser designed for single-longitudinal-mode operation.

U.S. Pat. No. 4,806,442 issued Feb. 21, 1984 to Shirasake et al entitled SPATIAL PHASE MODULATING MASKS AND PRODUCTION PROCESSES THEREOF, AND PROCESSES FOR THE FORMATION OF PHASE-SHIFTED DIFFRACTION GRATINGS relates to spatial phase modulating transparent masks comprising two or more portions having two different optical paths and their production processes are disclosed. The transparent masks are particularly useful as an exposure mask in the production of phase-shifted, distributed feedback (DFB) semiconductor lasers for a single-mode operation. A process for the formation of phase-shifted diffraction grating or corrugations which comprises exposing a substrate, through the above transparent mask, to exposure radiation is also disclosed. According to the present invention, the phase-shifted diffraction grating can be easily and directly produced with a high accuracy and reliability.

SUMMARY OF THE INVENTION

The alternating-element phase-shifting mask (Alt PSM) has the potential to double the resolution of a given optical imaging system. It is the most effective phase shifting mask for closely packed structures. Its isofocus characteristics are also very desirable. However, when there is variable packing in the mask, the alternating phase shifting mask is less effective. Furthermore, it does not work on isolated openings or isolated opaque features. The attenuated phase shifting mask (Att PSM) works on arbitrary mask patterns but the improvement of its imaging performance for closely packed patterns is negligible.

In the present invention, Att PSM is combined with Alt PSM so that the advantages of both PSM systems can be realized. An object of the present invention is to combine the Alt PSM with the Att-Utt (Attenuated-Unattenuated) combination.

An object of the present invention is to provide a PSM consisting of an Att PSM background wherein the phase in the openings is shifted alternately.

Another object of the present invention is to provide a PSM consisting of shifted and unshifted attenuated backgrounds wherein the shifted attenuated background surrounds the unshifted openings and the unshifted attenuated background surrounds the shifted openings.

Still another object of the present invention is to provide an attenuated PSM where small features consisting of attenuated shifted elements are reduced in attenuation, the ultimate reduction makes it totally unattenuated.

A still further object of the present invention is to provide PSM consisting of shifted and unshifted backgrounds where small features consisting of attenuated shifted elements are reduced in attenuation, the ultimate reduction makes it totally unattenuated.

BRIEF DESCRIPTION OF THE DRAWINGS

The above set further and other features of the invention are made more apparent in the ensuing Detailed Description of the Invention when read in conjunction with the attached drawings, wherein.

DESCRIPTION OF THE PREFERRED EMBODIMENTS

Figure 1:
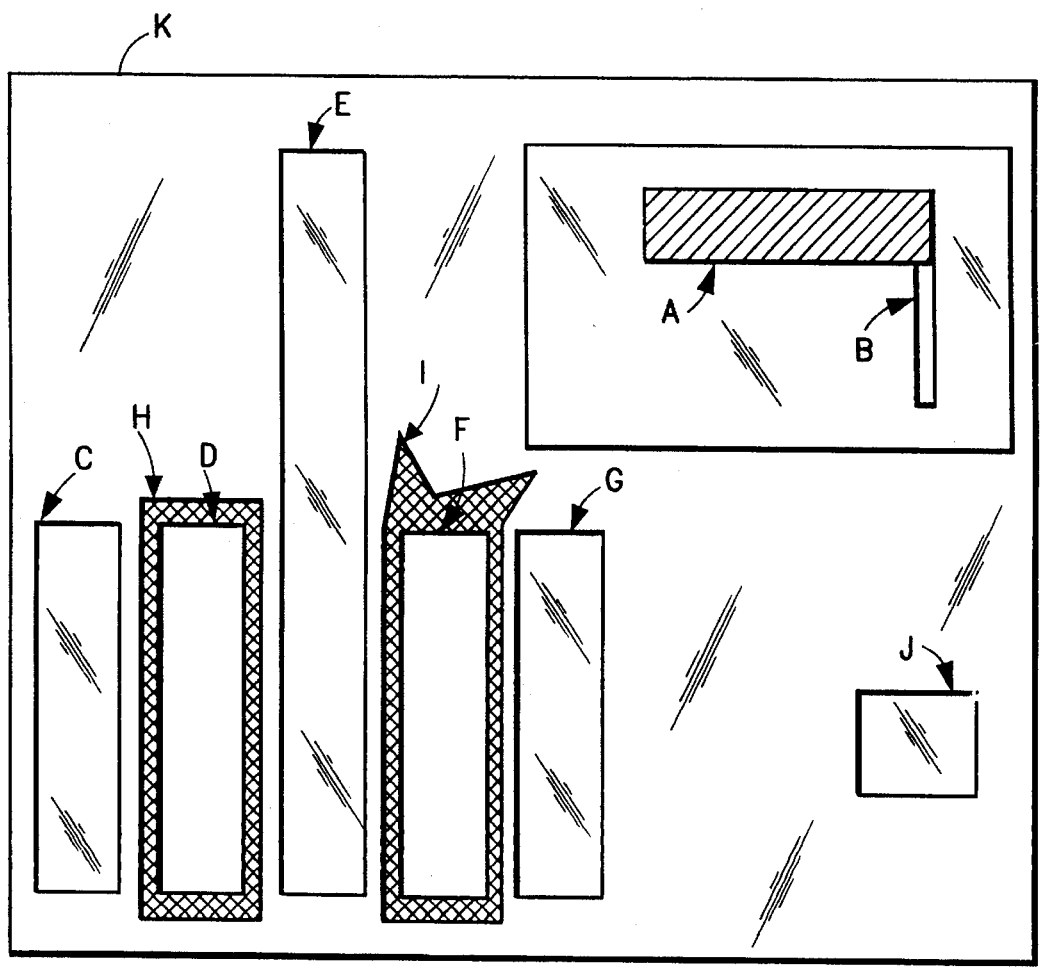
FIG. 1 is a schematic illustration of a combination of an Alt PSM and an Att-Utt PSM to form a Alt-Att-Utt PSM mask.
Figure 2:
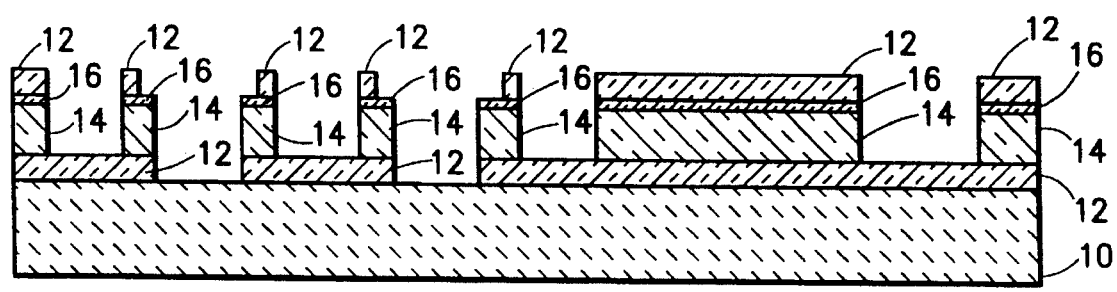
FIG. 2 is a schematic illustration of a side view of the Alt-Att-Utt PSM of FIG. 1.

Referring to FIG. 1, a plan view of a combined alternating (Alt) and Attenuate-Unattenuated (Att-Utt), phase shifted mask (Alt-Att-Utt PSM) is shown. FIG. 2 illustrates the side view of the mask of FIG. 1. In FIGS. 1 and 2, the cross-hatching that extends from upper right to lower left represents an attenuator element, cross-hatching extending from lower left to upper right represents a phase shifter element, and the combined cross-hatching shown in FIG. 1 indicates where attenuator and phase shift elements overlap. In FIG. 2, a substrate 10, composed for example of quartz, has discrete layers of phase shift material 12 such as silicon nitride ($Si_3N_4$) or other suitable transparent material such as oxides or oxynitrides may be used. The phase shifter 12 provides a 180 degree phase shift to light transmitted through it in a manner well known in the art. Transparent regions 14 which also may be composed of quartz are disposed on the phase shifters 12 and attenuator material 16 is disposed on the top of regions 14. The majority of the attenuator regions of the mask of FIGS. 1 and 2 are slightly transmissive absorbers and π shifted openings such as the background K with respect to openings C, E, G and J. The slightly transmissive, π shifted absorber is indicated by letters H, A and I in FIG. 1 and is composed, for example, of chromium plus a phase shifting layer. In the areas where isolated, small, opaque features are required, the unattenuated phase shifter indicated by letter B in FIG. 1 is used instead of the Att PSM.

Where there are closely packed patterns such as indicated by letters C, D, E, F and G, every other element (D and G) is shifted by −π. The shifted elements are each decorated by a rim that has the same transmission as the Att PSM but shifts 3π. The shape and size of the rim is much less critical than the rim used in the mask known as the Rim PSM discussed in aforesaid U.S. Pat. No. 5,288,569. In this configuration, each of the closely packed elements is surrounded by an attenuated phase shifter; whereas, it is also π-shifted with respect to its close neighbor. The extra opaque line between the shifted and unshifted elements such as lines designated by letters H and I in FIG. 1 do not print, because they are imbedded in a background of low transmission. The regions H and I are 3π shifted which is equivalent to π shift. The background area K is 4π shifted which is equivalent to zero phase shift.

Figure 3:
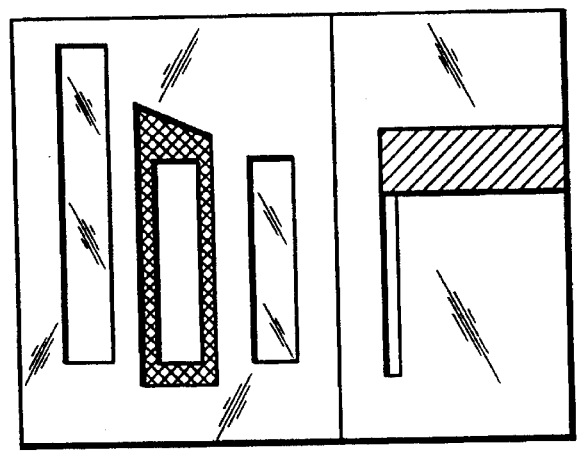
FIGS. 3, 4, 5, 6 and 7 are schematic illustrations of various stages in the fabrication of the Alt-Att-Utt PSM.
Figure 4:
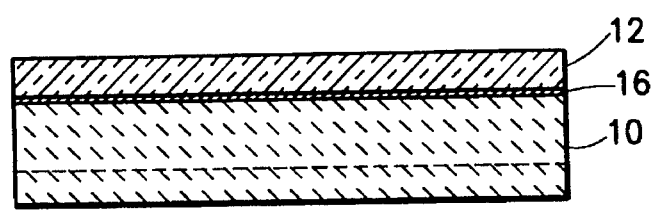
Figure 5:
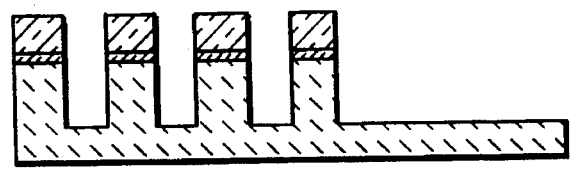
Figure 6:
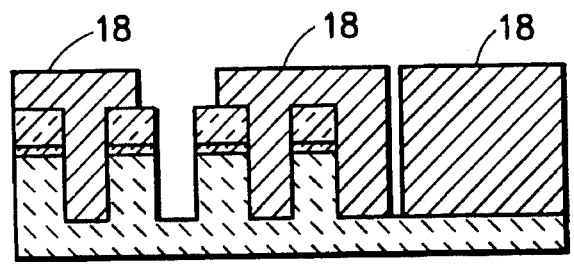
Figure 7:
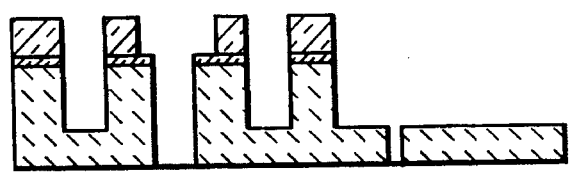

The fabrication of the Alt-Att-Utt PSM (AAU PSM) embodiment of the present invention is shown in FIGS. 3, 4, 5, 6 and 7. The process starts with a mask blank consisting of a quartz substrate 10 and layer of transmissive absorber 16, and a layer of π phase shifter 12, as shown in FIG. 4. The transmissive absorber 16 inherently shifts phase by an amount θ which is assumed to be 30° for simplicity, without violating the spirit of this invention. Step 1 consists of delineating all the π attenuated phase shifters, followed with etching 330°, or 2π-θ, into the quartz substrate as shown in FIG. 5. In step 2, a second-level photoresist 18 is now applied and exposed with proper alignment to the pattern 1 delineated in step 1 as shown in FIG. 6. This exposure level selects the 3π-shifted rim and the Utt PSM areas for subsequent etching in step 3 as shown in FIG. 7. The plan view of the mask structure of FIG. 7 is shown in FIG. 3.

Figure 8:
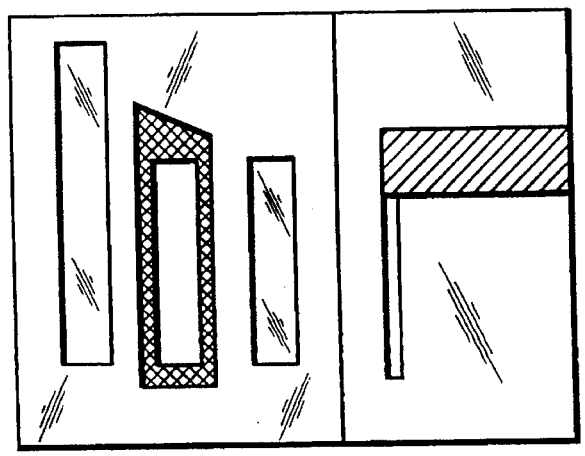
FIGS. 8, 9, 10, 11 and 12 are schematic illustrations of various stages in another fabrication method for the Alt-Att-Utt PSM.

An alternate fabrication scheme utilizes two extra phase shifting layers with high etch selectivity to each other; one shifts phase by 330°, or 2π-θ, the other layer is simply a π phase shifter as shown in FIG. 8. The fabrication steps are identical to those shown in FIGS. 4, 5, 6 and 7 except that the selectivity of the phase shifting layer helps to maintain etch uniformity. Thin etch stop layers can be inserted between layers requiring etch selectivity to further enhance it.

Figure 9:
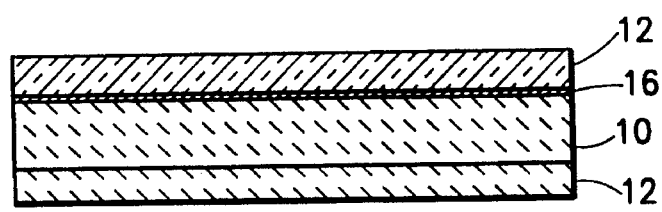
Figure 10:
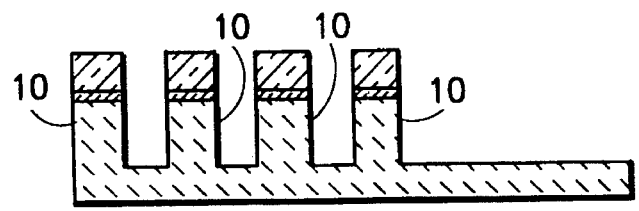
Figure 11:
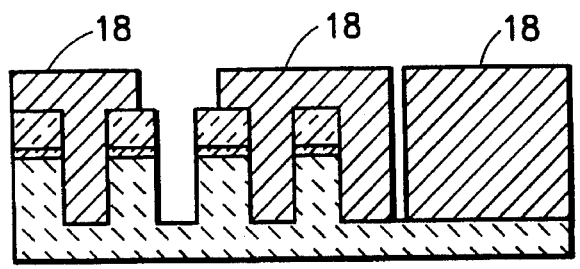
Figure 12:
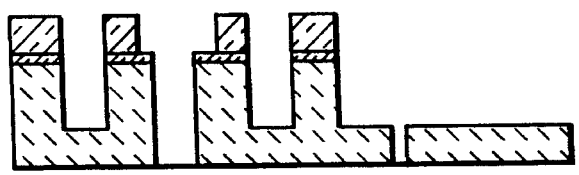
Figure 13:
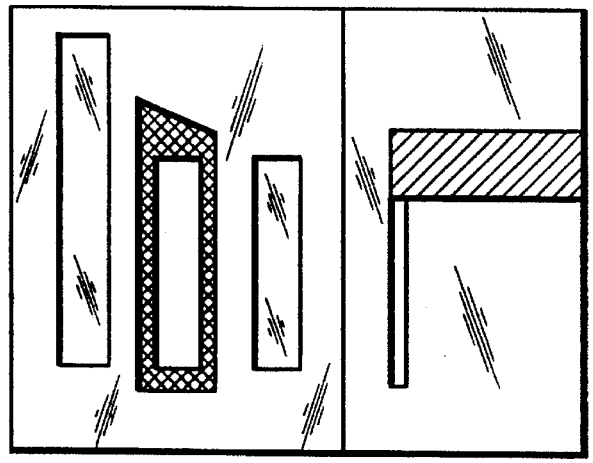
FIGS. 13, 14, 15, 16 and 17 are schematic illustrations of various steps in still another fabrication method for the Alt-Att-Utt PSM.
Figure 14:
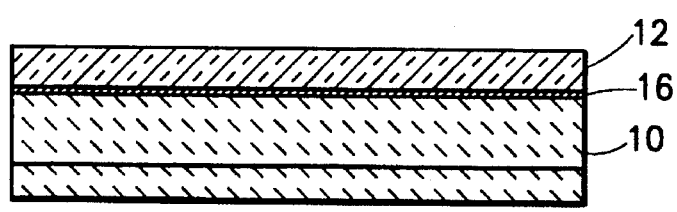
Figure 15:
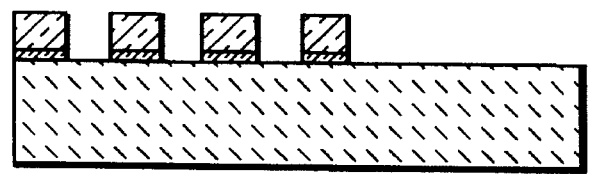
Figure 16:
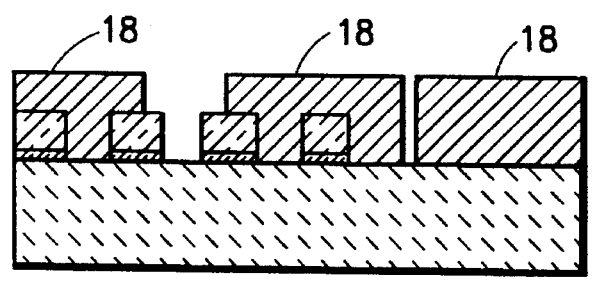
Figure 17:
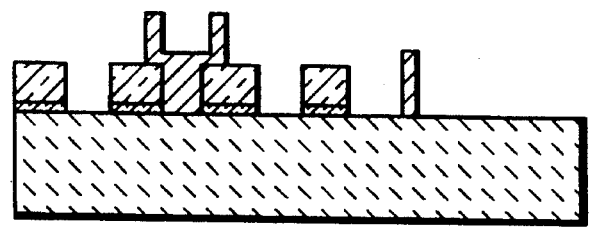

Yet another means to fabricate Alt-All-Utt PSM is to start with the substrate of FIG. 14 (which is the same as FIG. 4). Step 1 delineates the attenuated π-shifters 12, 16 but does not etch into the quartz substrate 10 as shown in FIG. 15. Using photoresist layer 18, step 2 opens the rim and unattenuated areas for a π-shifter lift off process in step 3 to complete the fabrication (FIG. 17). The lift off step can also be used with the substrate of FIG. 9.

Figure 18:
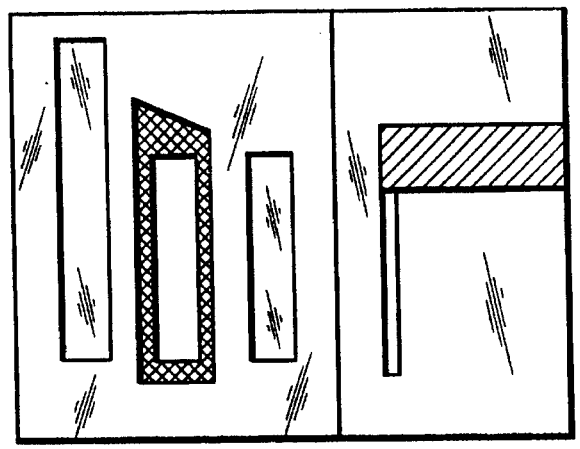
FIGS. 18, 19, 20, 21 and 22 are schematic illustrations of various steps in a simplified fabrication method for the Alt-Att-Utt PSM.
Figure 19:
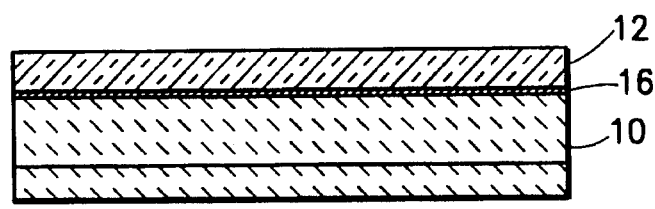
Figure 20:
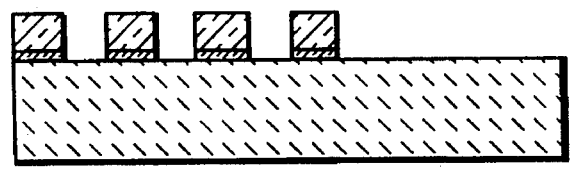
Figure 21:
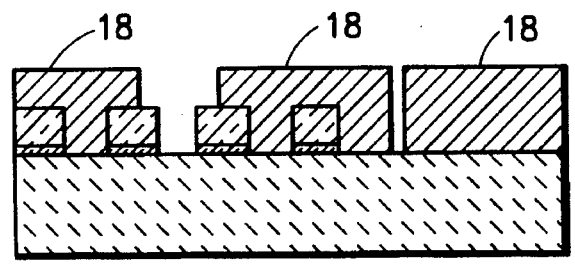
Figure 22:
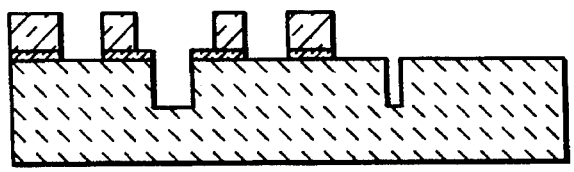

The processing can be simplified by allowing regions 8 and 9 to phase shift only 150° or 210°. This is shown in FIG. 18. The Att PSM component is delineated normally as shown in FIG. 19. Then a 2nd level resist application and aligned exposure opens the Utt PSM areas as well as area to be alternately phase shifted, as shown in FIG. 20. Even though the 150° phase shifters are completely removed by etching, the inherent phase shift caused by the attenuating layer is not eliminated, resulting in a 210° attenuated phase shifting background for these alternately shifted opening. In addition to normal biasing making unequal lines and spaces on the mask to result in equal lines and spaces on the wafer, the mask may be further biased to compensate for the slight asymmetry of this configuration.

What has been described is an improved phase shifting mask which combines the advantages of an attenuated phase shifting mask and an alternating element phase shifting mask, and which also includes unattenuated regions.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A phase-shifting mask structure having composite pattern material disposed on a substrate and comprising:

a substantially transparent substrate, discrete component layers of first radiation phase shifting material disposed on selected regions of said substrate for shifting radiation a first amount of radian phase shift, discrete component layers of radiation attenuating material disposed on selected regions of said substrate, discrete component layers of radiation second phase shifting material disposed on selected regions of said layers of attenuating material for shifting radiation a second amount of radian phase shift different from said first amount of radian phase shift, said discrete component layers of said first and second radiation phase shifting material being disposed on said substrate in separate alternating regions of adjacent first radian phase shift and second radian phase shift material to provide a phase-shifting mask structure having first phase-shifting, second phase-shifting and attenuated regions wherein first phase-shifting attenuated regions surround second phase-shifting regions and second phase-shifting attenuated regions surround first phase-shifting regions.

2. A phase-shifting mask structure according to claim 1 including first attenuated regions with zero radians phase shift and second phase-shifted regions with a π-φ phase shift components where φ is substantially 30 degrees.

3. A phase-shifting mask structure according to claim 2 further including a 2π-φ phase shift component.

4. A phase-shifting mask structure according to claim 2 further including a 3π-φ phase shift component.

5. A phase-shifting mask structure according to claim 2 further including a 4π-φ phase shift component.

6. A method for fabricating a phase-shifting mask comprising the steps of:

Step 1 disposing a layer of transparent material on a substantially transparent substrate and disposing a layer of transmissive absorber material on said layer of transparent material on said substantially transparent substrate, Step 2 disposing phase-shifting material on said layer of transmissive absorber material to provide a composite attenuated phase-shifting layer, Step 3 disposing a first layer of photoresist on said composite layer and exposing and patterning said photoresist, delineating and etching said phase-shifting material, said absorber material and said layer of transmissive material to form a pattern of separate discrete portions of, transmissive material absorber and phase-shift material on said substrate, Step 4 applying a layer of photoresist on said substrate and discrete layers formed in Step 3, Step 5 exposing and etching said photoresist to form an etch mask over selected regions of said discrete portions of phase-shift material, and Step 6 etching said discrete portions of phase-shift material to remove said selected regions of said phase-shift material.

7. A method according to claim 6 wherein said phase-shift material in step 6 is removed by lift-off.

* * * * *